United States Patent
Stelzl et al.

(10) Patent No.: US 7,259,041 B2
(45) Date of Patent: Aug. 21, 2007

(54) METHOD FOR THE HERMETIC ENCAPSULATION OF A COMPONENT

(75) Inventors: Alois Stelzl, München (DE); Hans Krueger, München (DE); Ernst Christl, Vilsbiburg (DE)

(73) Assignee: Epcos AG, Munich (DE)

( * ) Notice: Subject to any disclaimer, the term of this patent is extended or adjusted under 35 U.S.C. 154(b) by 324 days.

(21) Appl. No.: 10/500,279

(22) PCT Filed: Dec. 18, 2002

(86) PCT No.: PCT/DE02/04637

§ 371 (c)(1),
(2), (4) Date: Jan. 26, 2005

(87) PCT Pub. No.: WO03/058812

PCT Pub. Date: Jul. 17, 2003

(65) Prior Publication Data

US 2005/0121785 A1 Jun. 9, 2005

(30) Foreign Application Priority Data

Dec. 28, 2001 (DE) ............................... 101 64 502

(51) Int. Cl.
*H01L 21/50* (2006.01)
*H01L 21/48* (2006.01)
*H01L 21/44* (2006.01)
*H01L 23/552* (2006.01)

(52) U.S. Cl. .................. 438/106; 438/127; 257/659; 257/660; 257/E23.114

(58) Field of Classification Search ............... 438/106, 438/127; 257/659–660, E23.114
See application file for complete search history.

(56) References Cited

U.S. PATENT DOCUMENTS

| 4,711,795 | A | * | 12/1987 | Takeuchi et al. ............. 427/130 |
| 5,294,826 | A | * | 3/1994 | Marcantonio et al. ...... 257/659 |
| 5,639,989 | A | * | 6/1997 | Higgins, III ................ 174/386 |
| 6,197,619 | B1 | * | 3/2001 | Gaynes et al. .............. 438/124 |
| 6,472,724 | B1 | * | 10/2002 | Matsuzawa et al. ........ 257/659 |

(Continued)

FOREIGN PATENT DOCUMENTS

EP       0 740 340       10/1996

(Continued)

OTHER PUBLICATIONS

Abstract of Japanese Application 07-111438, Apr. 25, 1995, *Patent Abstracts of Japan*, vol. 1995, No. 07, Aug. 31, 1995.

(Continued)

*Primary Examiner*—Luan Thai
(74) *Attorney, Agent, or Firm*—Schiff Hardin LLP

(57) ABSTRACT

For hermetic encapsulation of a component, which includes a chip with component structures applied on a substrate in a flip-chip construction, a material is applied onto the lower edge of the chip and regions of the substrate abutting the chip, and then a first continuous metal layer is applied on the back side of the chip and on the material, as well as on edge regions of the substrate abutting the material. For hermetic encapsulation, a second sealing metal layer is subsequently applied by a solvent-free process at least on those regions of the first metal layer that cover the material.

16 Claims, 4 Drawing Sheets

U.S. PATENT DOCUMENTS

| | | | |
|---|---|---|---|
| 6,492,194 B1 * | 12/2002 | Bureau et al. | 438/106 |
| 6,528,924 B1 | 3/2003 | Stelzl et al. | |
| 6,649,446 B1 * | 11/2003 | Goetz et al. | 438/110 |
| 6,722,030 B1 * | 4/2004 | Stelzl et al. | 29/841 |
| 6,740,959 B2 * | 5/2004 | Alcoe et al. | 257/659 |
| 6,838,739 B2 * | 1/2005 | Stelzl et al. | 257/416 |
| 2001/0009277 A1 | 7/2001 | Gaynes et al. | |

FOREIGN PATENT DOCUMENTS

| | | |
|---|---|---|
| EP | 0 840 369 | 5/1998 |
| EP | 0 896 427 | 2/1999 |
| EP | 1 093 159 | 4/2001 |
| WO | WO97/24955 | 12/1997 |
| WO | WO99/43084 | 8/1999 |

OTHER PUBLICATIONS

Selmeier et al, "Recent Advances in SAW Packaging", *2001 IEEE Ultrasonics Symposium*, Oct. 7, 2001, pp. 283-292.

* cited by examiner

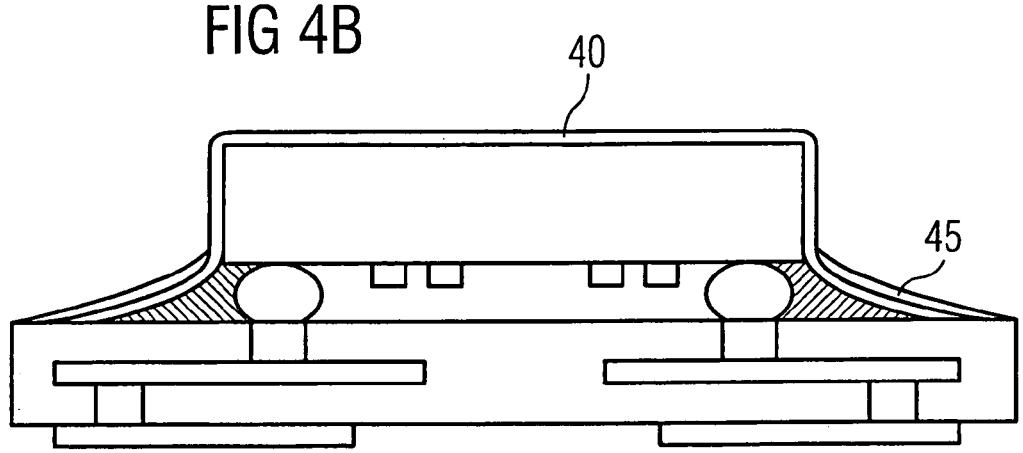
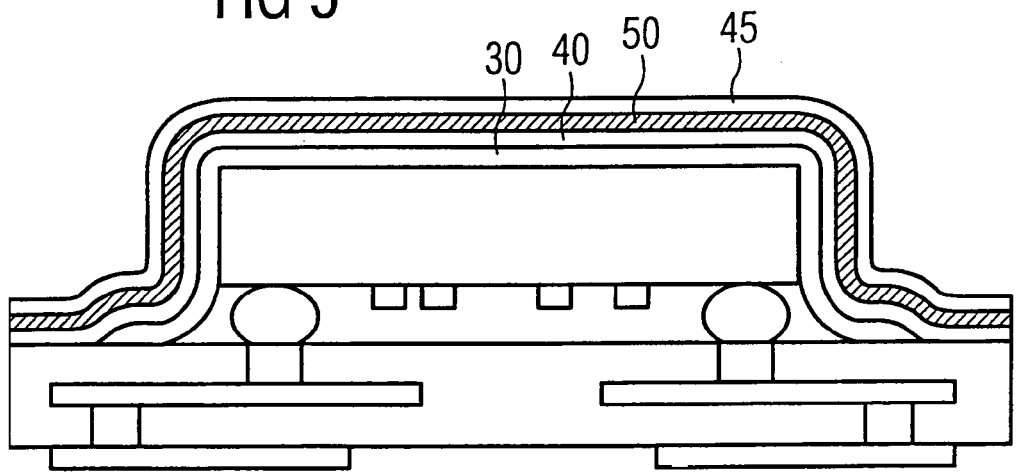

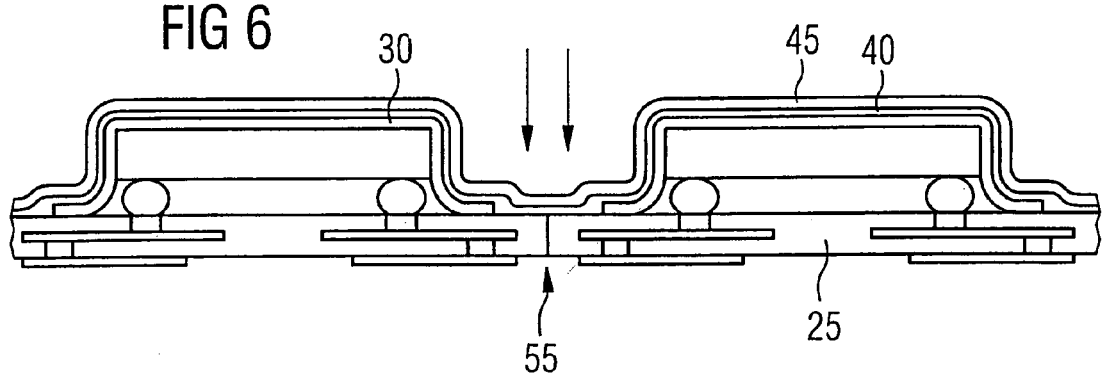
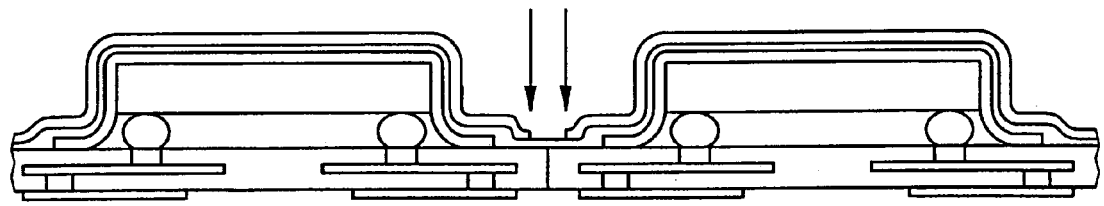
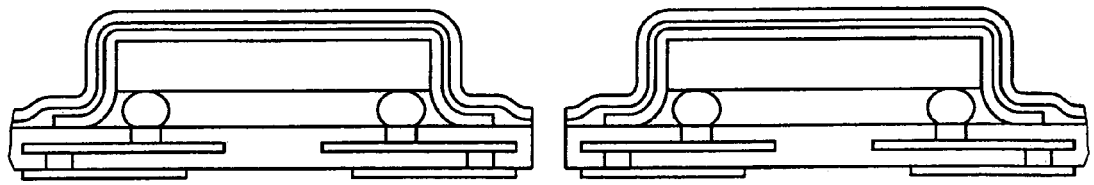

METHOD FOR THE HERMETIC ENCAPSULATION OF A COMPONENT

BACKGROUND OF THE INVENTION

A method for hermetic encapsulation of a component is, for example, known from WO 99/43084. There components, in particular surface wave components, are applied in a flip-chip technique to a substrate provided with solderable connection areas. The component, which is fashioned on the chip, is thereby soldered to the substrate over bumps (solder balls) at a slight distance from the substrate, such that the component structures located on the chip face the substrate. For hermetic encapsulation of the components located on the substrate, said components are ultimately covered from the back with a metal foil or a metal-coated plastic film (first metal layer) on the substrate and glued or laminated. The foil thereby seals tight with the substrate between the components, such that an encapsulation is created for the component structures.

After the application of the electrical component on the substrate, the lower edge of the chip and regions of the substrate abutting the chip are frequently covered with a material (under filler), for example organosilic compound or epoxy resin filled with quartz, on which the first metal layer mentioned above is subsequently applied. In another embodiment, for example, a plastic film is applied on the back side of the component chip and regions of the substrate abutting the component, and the film is subsequently sealed with the substrate. The first metal layer is subsequently applied on this film.

In order to tightly encapsulate the component, a second metal layer is normally deposited galvanically or, respectively, without current on this first metal layer. During this galvanic process, small quantities of water can penetrate into the electrical component. This water can lead to long-term corrosion of the electrical component. Until now, after the galvanic reinforcement of the first metal layer, this moisture has only been homogenously distributed in the component via a tempering step at a typical temperature of 125° C., without completely removing the moisture from said component.

SUMMARY OF THE INVENTION

It is therefore the object of the invention to specify a method for hermetic encapsulation of an electrical component which is simple to implement and prevents the disadvantages cited above.

The invention proposes to first apply a component fashioned on a chip onto a substrate in a conventional flip-chip construction (method step A) and to subsequently cover at least the lower edge of the chip and regions of the substrate abutting the chip with a material in a conventional manner in method step B). In method step C), a first continuous metal layer is subsequently applied on the back side of the chip, on the material and on edge regions of the substrate abutting the material. A second hermetically sealing metal layer that covers the material is subsequently, inventively applied, at least on the regions of the first metal layer, whereby this second metal layer is applied by means of a solvent-free and in particular water-free process (method step D). An electroplating using water-free organic solvent is alternatively also possible.

In contrast to the prior art, the second metal layer is not applied by means of a galvanic process in which water as solvent penetrates into the component and can cause a corrosion of the component. Furthermore, the second metal layer is not applied on all regions on which the first continuous metal layer is present, but rather only on those regions of the first metal layer that cover the insulating material. This has the advantage that, in the inventive method, the consumption of the metal can be significantly reduced for the second metal layer.

A whole series of processes are considered for a solvent-free process in the method step B) to apply the second hermetically sealing metal layer. Thus, for example, it is possible to melt a metal foil onto the first metal layer. Before the application, this metal foil is advantageously adapted (stamped) to the contours of the first metal layer, such that it attaches to the first metal layer with a positive fit. This has the advantage that, upon melting of this metal foil on the first metal layer, the second metal layer is generated with homogenous layer thickness, such that it particularly tightly seals the component.

Furthermore, it is possible that metal particles are applied in the method step D). This can, for example, be implemented with the aid of a spray method in which the fluid metal beads are sprayed. Furthermore, in a further embodiment of the inventive method, a metal paste can be applied and then baked. The second metal layer can also be applied by means of chemical vapor deposition (CVD) or physical vapor deposition (PVD). Furthermore, the second metal layer can also be sputtered or deposited galvanically or without current with a water-free electrolyte.

The second metal layer can be applied continuously onto the first metal layer. In this case, the second metal layer thus covers not only those regions of the first metal layer that cover the material, but rather also further regions of the first metal layer that, for example, cover the back side of the chip.

In a further advantageous variant of the inventive method, before the application of the second metal layer, a surface layer of the first metal layer can be removed to improve the bonding. Due to oxidation processes, a metal oxide layer to which the second metal layer bonds only in a limited manner frequently forms on the first layer. For this reason, this oxide layer is advantageously removed, for example via a reducing hydrogen plasma, before the application of the second metal layer.

In another embodiment of the inventive method, in the method step B) the material is, for example, applied in the form of a plastic film, such that the plastic film covers the back side of the chip and simultaneously the edges of the film overlap the chip. The film is subsequently sealed with the substrate in the entire edge region around the chip. The first metal layer is then applied onto this plastic film in the further method step C). This variant of the inventive method has the advantage that the method steps B) (application of the plastic film) and the method step C) (application of the first continuous metal layer) can be particularly well optimized independent of one another. In cooperation with the last method step D), a particularly secure hermetic encapsulation of the electrical component is thus possible via the application of the second metal layer. In this variant of the inventive method, the second hermetically sealing metal layer is advantageously applied over the entire first continuous metal layer. It is thereby particularly advantageously ensured that, in components encapsulated according to this variant, no moisture can penetrate through both metal layers into the plastic film, and thus also into the component.

In a further variant of the inventive method, the metals for the first and second metal layer and the process conditions for the application of the second metal layer in the method step D) are selected such that, during the application of the second metal layer, a metal alloy with a melting point of more than 260° C. is formed at the boundary area between the two metal layers. This has the advantage that the metal alloy does not melt, and therefore is also not permeable or loses rigidity, upon soldering of the inventively encapsulated component, which normally ensues at temperatures below 260° C. Such encapsulated component can thus be soldered without large problems as SMD components by means of standard soldering methods.

As a first metal layer, a titanium-copper layer is advantageously applied in which a thicker copper layer is applied as a bonding agent to a very thin titanium layer. As a second metal layer, tin or eutectic tin alloys, for example, tin-silver, tin-copper or tin-silver copper alloys or a mix of the cited metals, are advantageously applied. This has the advantage that the cited metals or, respectively, metal alloys are very inexpensive for the first and second metal layer, but at the same time a non-eutectic tin-copper alloy with a melting point of greater than 260° C. is formed at the boundary area between the first metal layer and the second metal layer upon application of the second metal layer. By means of this variant of the inventive method, it is thus particularly advantageously possible to generate, by means of inexpensive output materials for both of the metal layers, an alloy with a particularly high melting point that can not be melted during standard soldering methods at standard temperature. The materials cited above for the second metal layer thereby exhibit melting points between approximately 217° C. and 232° C. before the alloy formation.

In another variant of the inventive method, it is also possible to apply a metal layer from the start in method step D) that exhibits a melting point greater than 260° C. For example, tin-gold alloys with melting points of approximately 280° C. are considered for this alternative.

The inventive method can be used for a hermetic encapsulation of the most varied components that can be mounted in flip-chip configuration, for example surface wave filters or other (particular surface-sensitive) components.

In the following, the inventive method should be explained in further detail using Figures.

BRIEF DESCRIPTION OF THE DRAWINGS

FIGS. 4A and 4B show the electrical component after the fourth method step or method step D), which is the application of the second metal layer;

FIG. 5 shows the formation of an alloy with a high melting point between the first metal layer and second metal layer; and FIGS. 6 through 8 show the division of the substrate between two components that have been applied, contacted and encapsulated on the substrate according to the method steps A) through D).

DESCRIPTION OF THE PREFERRED EMBODIMENTS

Figure 1:
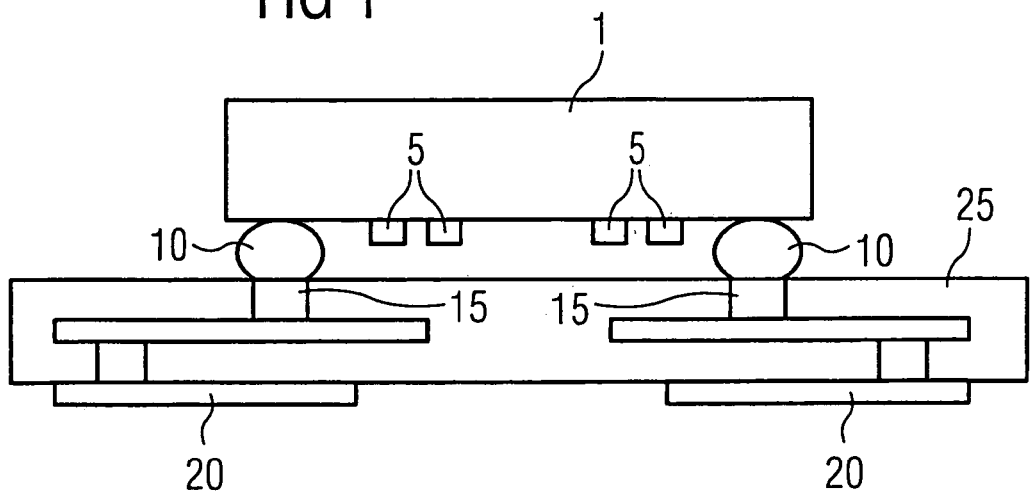
FIG. 1 shows the first method step or method step A) of the inventive method.

FIG. 1 shows an electrical component after the method step A). It is visible that a chip 1 is attached and contacted on a substrate 25 such that the component structures 5 located on the chip surface face the substrate 25. Solder balls 10 (bumps) thereby affix the component at a slight distance from the substrate and simultaneously electrically-conductively connect the connection areas 20 located on the substrate 25 with the component. A feedthrough 15 thereby provides for electrical contact between the connection areas 20 and the bumps 10.

Figure 2A:
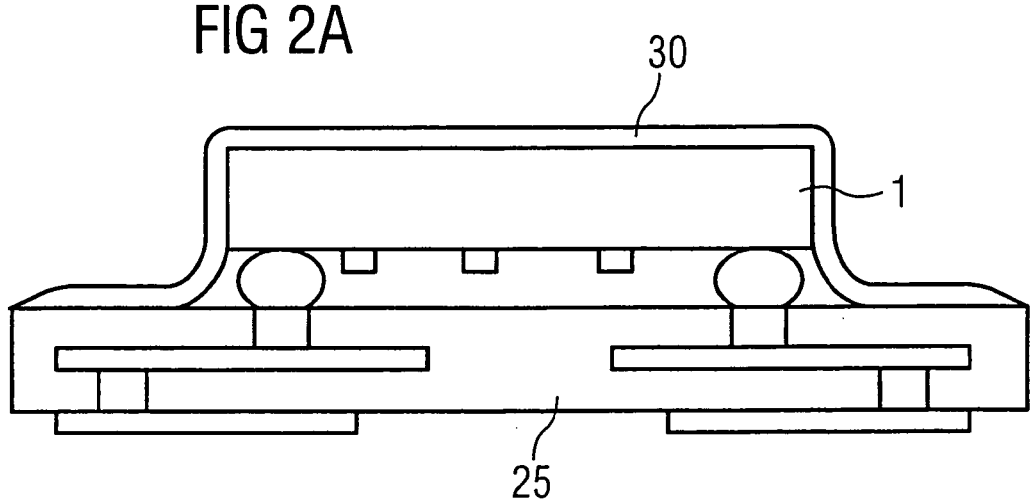
FIGS. 2A and 2B show two embodiments or variations of the second method step or method step B)
Figure 2B:
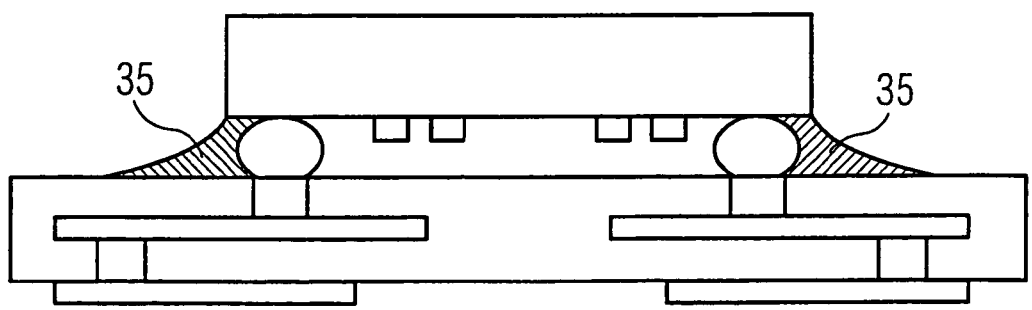

FIG. 2A shows a variant of the method steps B) of the inventive method. A plastic film 30 is continuously applied over the back side of the chip 1 and the regions of the substrate 25 abutting the chip, and has subsequently been sealed with the substrate in the entire edge region of the chip. An embodiment alternative to FIG. 2A is visible in FIG. 2B. The space between lower edge of the chip 1 and the regions of the substrate abutting thereon have been covered with a material 35. This material can, for example, be formed of silicon-organic compounds.

Figure 3A:
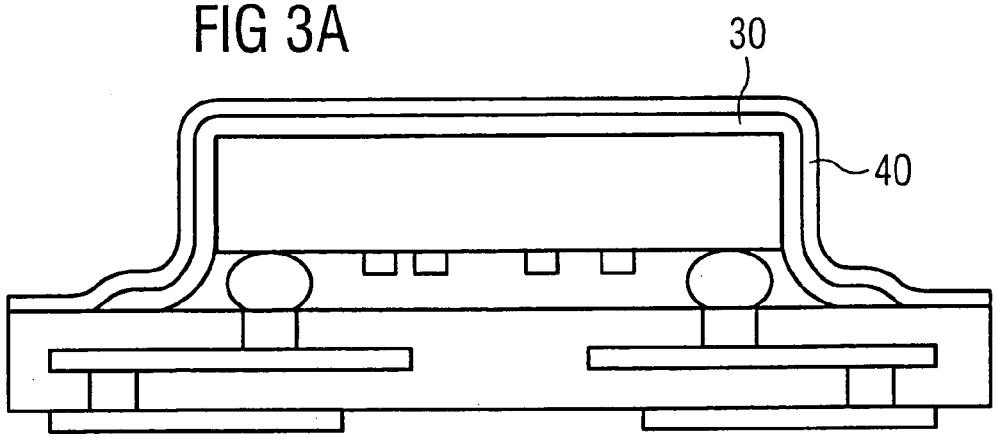
FIGS. 3A and 3B show both components shown in 2A and 2B after the third method step or method step C) of the inventive method.
Figure 3B:
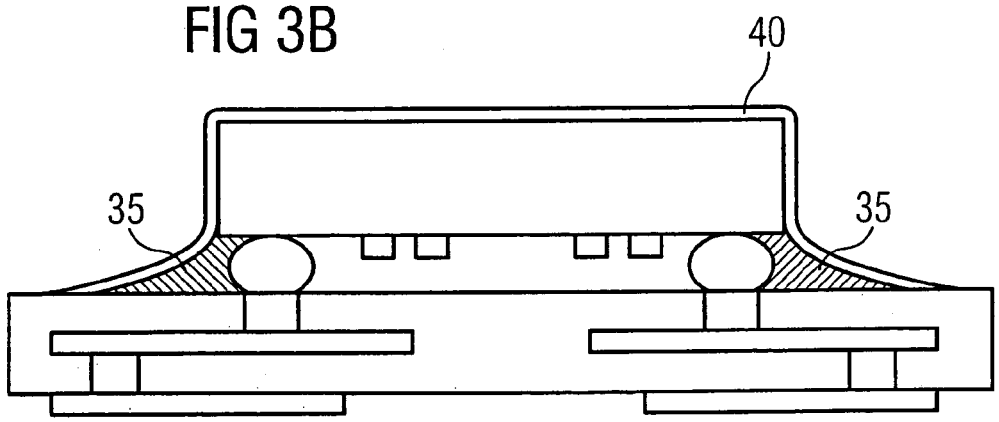

The component shown in FIG. 2A is visible in FIG. 3A after the method step C). The first metal layer 40, for example a titanium-copper layer, has been applied on the plastic film 30. FIG. 3B likewise shows the component shown in FIG. 2B after the method step C). In this case, the first metal layer 40 has likewise been applied on the material 35 and the back side of the chip. The first metal layer 40 can, for example, be sputtered.

Figure 4A:
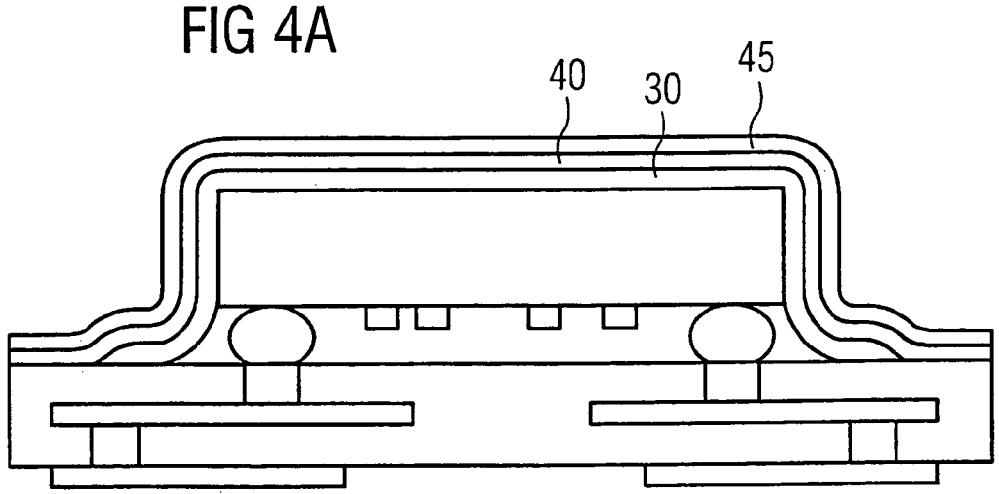

FIG. 4A shows the component from FIG. 3A after the application of the second metal layer 45 (method step D). In this case, the second metal layer 45 has been applied on the first layer 40 such that the first metal layer 40 is completely covered by the second metal layer. FIG. 4B likewise shows the component shown in FIG. 3B after the method step D). In this embodiment, the second metal layer 45 is applied only on those regions of the first metal layer that cover the material 35, which is sufficient for encapsulation.

FIG. 5 shows a layer 50 that has been formed on the boundary area of the first metal layer 40 and the second metal layer 45 upon application of the second metal layer 45. This intermediate layer 50 advantageously exhibits a melting point of greater than 260° C., such that the inventive encapsulation of the component no longer melts upon soldering. If a titanium-copper layer is applied as a first layer 40, either tin or eutectic tin alloys, for example, tin-silver, tin-silver-copper or tin-copper alloys, can advantageously be used as a second layer 45. These eutectics exhibit a homogenous composition and have defined melting points of approximately 217° C. to 232° C. If the second metal layer is applied on the first metal layer at temperatures greater than approximately 280° C., thus the melting point of tin/gold, a non-eutectic tin-copper alloy that exhibits a melting point greater than 260° C. forms via bonding of parts of the copper of the first layer with component parts of the second layer. This non-eutectic alloy comprises larger portions of copper than the copper-containing eutectic alloys cited above.

FIG. 6 shows a plurality of components that have been applied, contacted and encapsulated on the substrate according to the method steps A) through D). It is thereby possible with the inventive method to apply and to encapsulate identical or different components on the substrate. The chips can subsequently be isolated at the dividing lines designated with 55. For this, as shown in FIG. 6 the second metal layer can be ablated, for example by means of a laser, in the region in which the substrate 25 is sectioned.

FIG. 7 shows how the first metal layer 40, which has been uncovered due to the laser method cited above, is removed by means of a selective chemical etching. Thus, for example, it is possible to use an iron chloride solution that selectively etches the first metal layer 40, which is formed of titanium and copper, without attacking the second metal layer 45, which is formed of tin or, respectively, tin alloys. After the removal of the first and second metal layer, the chips can, for example, be isolated via sawing of the substrate, as shown in FIG. 8.

The invention is not limited to the exemplary embodiments shown here. Further variations are possible, both with regard to the materials for the first and second metal layer and with regard to the type of the encapsulated components.

We claim:

1. A method for production of an encapsulated encapsulation for an electrical component comprising the steps of:
    attaching a component with metallizations respectively fashioned on each of a plurality of chips a chip to a substrate in a spaced manner that has electrical connection areas so that the surface of the plurality of chips bearing component structures faces the substrate and bump connections electrically connect the metallization of the substrate with the connection areas provided on each of the plurality of chips provide a slight distance from the substrate;
    applying a material to cover at least the lower edges of the plurality of chips and a region of the substrate abutting the edges of the plurality of chips;
    applying a first, continuous metal layer on the back side of the plurality of chips, on the material and on edge regions of the substrate abutting the material;
    applying a second, hermetically sealing metal layer by a solvent-free process at least on the regions of the first metal layer that cover the material;
    subsequent to applying the second metal layer on the chips, isolating the individual components by sectioning between the chips outside of the edge regions of each component;
    wherein the step of applying the first metal layer comprises applying a titanium layer and then a copper layer on each of the components, the step of applying the second metal layer comprises applying a metal layer selected from the group consisting of tin, tin-silver, tin-sliver copper alloys and mixtures of said metals on the first metal layer, said step of sectioning including removing the second metal layer in the regions to be sectioned to expose the first metal layer, chemically etching the exposed regions of the first metal layer to remove the exposed portions and subsequently sectioning by sawing the components apart.

2. A method according to claim 1, wherein the step of applying the second metal layer provides a metal foil placed onto the first metal layer and includes heating to melt the metal foil onto the first metal layer.

3. A method according to claim 2, wherein the step of providing the metal foil provides a metal foil having contours of the first metal layer so that it lies on the first metal layer with a positive fit.

4. A method according to claim 1, wherein the step of applying the second metal layer applies metal particles and then melts the particles onto the first metal layer.

5. A method according to claim 1, wherein the step of applying the second metal layer applies a metal paste and then bakes the paste onto the first metal layer.

6. A method according to claim 1, wherein the step of applying the second metal layer utilizes a process selected from CVD and PVD.

7. A method according to claim 1, wherein the step of applying a second metal layer sputters the second metal layer onto the first metal layer.

8. A method according to claim 1, wherein the step of applying the second metal layer applies the second layer continuously on the first metal layer.

9. A method according to claim 1, which, after applying the first metal layer and before applying the second metal layer, includes removing surface layers of the first metal layer to improve the bonding of the second metal layer thereon.

10. A method according to claim 1, wherein, after the step of applying the first metal layer, removing an oxide layer from the first metal layer via a hydrogen plasma.

11. A method according to claim 1, wherein the step of applying the material applies a plastic film on the back side of the chip to cover the back side, the edges of the chip and subsequently seals the film with the substrate in the entire edge region around the chip.

12. A method according to claim 1, wherein the step of applying the second metal layer creates a metal alloy with a melting point greater than 260° C. in the boundary surface between the first and second metal layers during the application of the second metal layer.

13. A method according to claim 1, wherein the step of applying the first metal layer applies a layer of titanium and a layer of copper on the layer of titanium.

14. A method according to claim 13, wherein the heating of the second metal layer produces a tin-copper alloy with a melting point greater than 260° C. in the boundary between the first metal layer and the second metal layer.

15. A method according to claim 1, wherein the step of chemically etching utilizes an iron chloride solution.

16. A method according to claim 1, wherein the component is a surface wave component.

* * * * *